(12) United States Patent
Bai et al.

(10) Patent No.: US 11,974,466 B2
(45) Date of Patent: Apr. 30, 2024

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Lu Bai, Beijing (CN); Li Song, Beijing (CN); Chang Luo, Beijing (CN); Sen Du, Beijing (CN); Pengfei Yu, Beijing (CN); Jie Dai, Beijing (CN); Yang Zhou, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 359 days.

(21) Appl. No.: 17/289,298

(22) PCT Filed: Jul. 27, 2020

(86) PCT No.: PCT/CN2020/104942
§ 371 (c)(1),
(2) Date: Apr. 28, 2021

(87) PCT Pub. No.: WO2022/021019
PCT Pub. Date: Feb. 3, 2022

(65) Prior Publication Data
US 2022/0320201 A1    Oct. 6, 2022

(51) Int. Cl.
*H01L 31/02* (2006.01)
*H10K 50/844* (2023.01)
*H10K 59/122* (2023.01)

(52) U.S. Cl.
CPC ......... *H10K 59/122* (2023.02); *H10K 50/844* (2023.02)

(58) Field of Classification Search
CPC .. H10K 59/122; H10K 59/123; H10K 50/824; H10K 50/844; H10K 50/8426;
(Continued)

(56) References Cited

U.S. PATENT DOCUMENTS 10,381,420 B2 * 8/2019 Liu ...................... G06F 3/0412
10,446,623 B2 * 10/2019 Cai ...................... H10K 50/822
(Continued)

FOREIGN PATENT DOCUMENTS

CN        104238200 A    12/2014
CN        109903709 A    1/2016
(Continued)

*Primary Examiner* — Samuel Park
(74) *Attorney, Agent, or Firm* — ArentFox Schiff LLP; Michael Fainberg

(57) ABSTRACT

A first planarization layer, an anode lap joint later, a pixel defining layer are between the first dam and the display area; the anode lap joint layer includes a main body portion and sharp angle portions; the sharp angle portion at least includes a first side edge close to the display area; the pixel defining layer wraps a border of the anode lap joint layer and has a first groove extending from one to the other sharp angle portion. An edge of the first groove adjacent to the first side edge of the sharp angle portion is a second side edge; and an orthographic projection of the second side edge on a base substrate is in an orthographic projection of the third groove on the base substrate.

16 Claims, 5 Drawing Sheets

(58) Field of Classification Search
CPC ............... H10K 59/124; H10K 59/131; H10K 59/1315; H01L 27/0288; H01L 27/124; G01N 27/041; G09G 3/006; G09G 3/3323; G09G 3/3258; G09G 3/3291; G09G 2300/0426; G09G 2300/0842
USPC ...... 345/33, 38, 104, 204, 205, 211; 438/30, 438/42, 337, 626, FOR. 157, FOR. 172
See application file for complete search history.

(56) References Cited

U.S. PATENT DOCUMENTS

| | | | |
|---|---|---|---|
| 10,854,846 B2 * | 12/2020 | Kim | ............... H10K 59/122 |
| 10,998,391 B2 * | 5/2021 | Bae | ............... H10K 59/122 |
| 2018/0124933 A1 * | 5/2018 | Park | ............... H10K 59/00 |
| 2018/0204895 A1 * | 7/2018 | Lin | ............... G09G 3/006 |
| 2019/0279575 A1 | 9/2019 | Kim | |
| 2020/0411615 A1 | 12/2020 | Ding et al. | |
| 2021/0225986 A1 | 7/2021 | Han | |
| 2021/0257434 A1 | 8/2021 | Xie et al. | |
| 2021/0408462 A1 * | 12/2021 | Tang | ............... H10K 59/122 |

FOREIGN PATENT DOCUMENTS

| | | | | |
|---|---|---|---|---|
| CN | 106953024 A | | 7/2017 | |
| CN | 107255655 A | * | 10/2017 | ........... G01N 27/041 |
| CN | 109742103 A | | 5/2019 | |
| CN | 109887963 A | * | 6/2019 | ........... G06K 9/0004 |
| CN | 109935730 A | | 6/2019 | |
| CN | 110246869 A | | 9/2019 | |
| CN | 110265579 A | | 9/2019 | |
| CN | 210245497 U | | 4/2020 | |
| CN | 111192974 A | | 5/2020 | |
| EP | 2413394 A2 | * | 2/2012 | ......... H01L 27/3276 |
| EP | 3683855 A2 | | 7/2020 | |

* cited by examiner

DISPLAY PANEL AND DISPLAY DEVICE

CROSS REFERENCE TO RELATED APPLICATIONS

This application is a national phase entry under 35 U.S.C. § 371 of International Application No. PCT/CN2020/104942, filed on Jul. 27, 2020, the entire content of which is incorporated herein by reference.

FIELD

This application relates to the field of display technology, in particular to a display panel and a display device.

BACKGROUND

At present, a flexible display panel which adopts an organic light-emitting diode (OLED) as a light-emitting device and adopts a thin film transistor to perform signal control prevails in the current OLED industry.

In the flexible display panel, a display substrate is packaged by means of a chemical vapor deposition process after being formed so as to protect the light-emitting device, and thus it is guaranteed that oxidizing reactions with the outside do not happen to the light-emitting device and other structures in the display panel. Once packaging fails, for example, a packaging membrane layer breaks and cracks, water vapor enters the display panel along cracks and the cracks of an organic layer or an inorganic layer will become water vapor passageways. After the water vapor invades an organic light-emitting material of the OLED, the organic light-emitting material is oxidized and loses effects, thereby failing to emit light. The failure area is gradually expanded along with continuous invasion of the water vapor, the display panel is poor in displaying, and the service life of the display panel is affected.

SUMMARY

Embodiments of the application provide a display panel and a display device, and the specific scheme is as follows.

A display panel provided by embodiments of the application includes a base substrate provided with a display area and a bezel area surrounding the display area. The bezel area includes a first dam surrounding the display area.

The display area includes an anode layer, a light-emitting layer and a cathode layer arranged on a side of the base substrate in sequence in a laminated mode.

A first metal layer, a first planarization layer, an anode lap joint layer, a pixel defining layer and the cathode layer arranged on the side of the base substrate in sequence in the laminated mode are disposed between the first dam and the display area.

The first metal layer at least includes a first supply voltage wire.

The anode lap joint layer and the anode layer are on the same layer.

The cathode layer is electrically connected with the first supply voltage wire through the anode lap joint layer.

The anode lap joint layer includes a main body portion and sharp angle portions located at two ends of the main body portion. The sharp angle portion at least includes a first side edge close to the display area.

The pixel defining layer wraps a border of the anode lap joint layer and is provided with a first groove. The first groove extends from one sharp angle portion of the anode lap joint portion to the other sharp angle portion of the anode lap joint layer, is located at a side of the sharp angle portion far away from the main body portion and is formed at a side of the sharp angle portion close to the display area. An edge of the first groove adjacent to the first side edge of the sharp angle portion is a second side edge, and an outline of the second side edge is consistent with that of the first side edges.

The first planarization layer is provided with a second groove, and an orthographic projection of the second side edge on the base substrate is located in an orthographic projection of the second groove on the base substrate.

Optionally, in the display panel provided by embodiments of the application, the first side edge of the sharp angle portion close to the display area is an oblique edge, and an included angle between the oblique edge and a border of the display area adjacent to the oblique edge is larger than 0° but smaller than or equal to 30°.

Optionally, in the display panel provided by embodiments of the application, the first side edge of the sharp angle portion close to the display area is in a step design.

Optionally, in the display panel provided by embodiments of the application, the pixel defining layer is further provided with a third groove.

An orthographic projection of the third groove on the base substrate is located in an orthographic projection of the anode lap joint layer on the base substrate.

An edge of the third groove adjacent to the first side edge of the sharp angle portion is a third side edge, and an outline of the third side edge is consistent with that of the first side edge.

An orthographic projection of the third side edge on the base substrate is located in the orthographic projection of the second groove on the base substrate.

Optionally, in the display panel provided by embodiments of the application, the first planarization layer wraps a border of the first supply voltage wire.

The orthographic projection of the second groove on the base substrate is located in an orthographic projection of the first supply voltage wire on the base substrate.

Optionally, in the display panel provided by embodiments of the application, the bezel area further includes:
  a second supply voltage wire located between the base substrate and the first supply voltage wire; and
  a second planarization layer located between the second supply voltage wire and the first supply voltage wire.

The second planarization layer is provided with a fourth groove, and an orthographic projection of the fourth groove on the base substrate at least covers the orthographic projection of the second groove on the base substrate.

The first supply voltage wire is electrically connected with the second supply voltage wire through the fourth groove.

Optionally, in the display panel provided by embodiments of the application, the orthographic projection of the fourth groove on the base substrate coincides with the orthographic projection of the second groove on the base substrate.

Optionally, in the display panel provided by embodiments of the application, the orthographic projection of the first supply voltage wire on the base substrate coincides with an orthographic projection of the second supply voltage wire on the base substrate.

Optionally, in the display panel provided by embodiments of the application, the bezel area further includes a second dam surrounding the first dam.

The pixel defining layer and the first planarization layer both cover an area where the second dam is located.

The pixel defining layer is provided with a fifth groove in an area corresponding to a gap between the first dam and the second dam.

The first planarization layer is provided with a sixth groove in an area corresponding to the gap between the first dam and the second dam.

Correspondingly, embodiments of the application further provide a display device, including a driving chip and any one of the display panels provided by embodiments of the application.

DETAILED DESCRIPTION OF THE EMBODIMENTS

In specific implementation, a water vapor channel can be avoided through a design or a process, however, in a cut-off position of an anode lap joint layer in a bezel area of a display panel, in order to prevent static electricity from damaging a back plate circuit through the anode lap joint layer with high conductivity, a border of the anode lap joint layer needs to be wrapped with a pixel defining layer made of an organic material. The pixel defining layer herein communicates with an organic layer in a dam, and consequently a water vapor passageway is unavoidably formed.

On that account, embodiments of the application provide a display panel and a display device, so that the risk of water vapor invasion into the display panel is reduced.

In order to make the above-mentioned objectives, features and advantages of the application clearer and more understandable, the application will be further described below in combination with the accompanying drawings and embodiments. Nevertheless, exemplary embodiments can be implemented in various modes but should not be constructed as limitation to the embodiments described herein. Rather, these embodiments are provided so as to make the application more comprehensive and complete, and the conception of the exemplary embodiments is fully conveyed to those skilled in the art. Same symbols in the accompanying drawings represent same or similar structures, and thus repetitive description is omitted. Terms for representing positions and directions described in the application are all illustrated with the accompanying drawings as examples, and meanwhile change can be made as required and should be within the protection scope of the application. The accompanying drawings of the application are only for illustrating the relative position relation but not represent the actual proportion.

It should be noted that the details are set forth in the following description so that the application can be fully understood. Meanwhile the application can be implemented in various other modes different from the modes described herein, and those skilled in the art can make similar popularization without violating the intension of the application. Therefore, the application is not limited by the specific embodiments disclosed as follows. The follow-up description of the specification is better embodiments for implementing the application but is only for describing general principles of the application and does not limit the scope of the application. The protection scope of the application should be determined by definitions of appended claims.

A display panel and a display device provided by embodiments of the application are specifically illustrated below in combination with the accompanying drawings.

Figure 1:
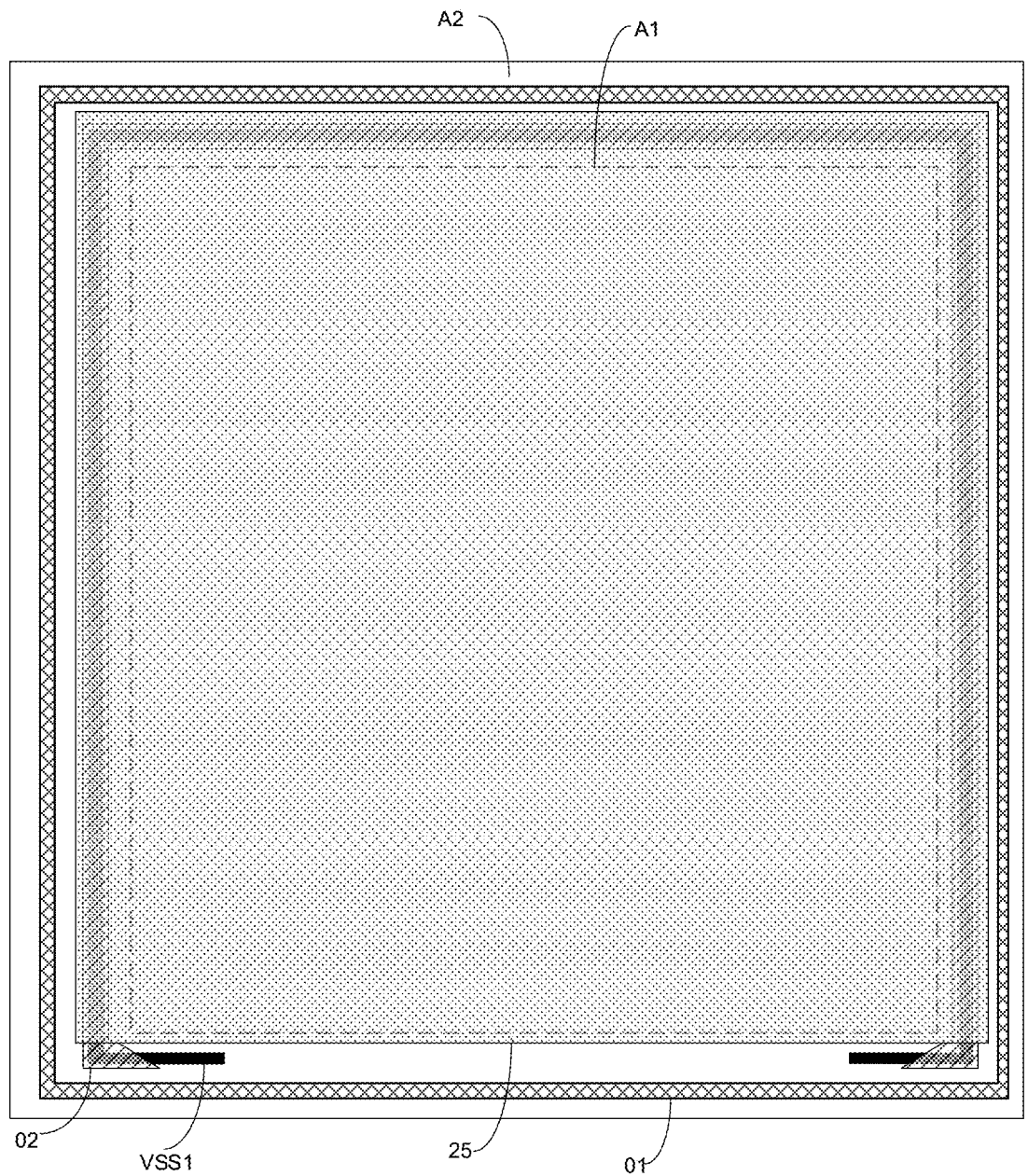
FIG. 1 is a first schematic diagram of a top-view structure of a display panel provided by an embodiment of the present application.

As shown in FIG. 1, a display panel provided by embodiments of the application includes a base substrate having a display area A1 and a bezel area A2 surrounding the display area A1.

Figure 2:
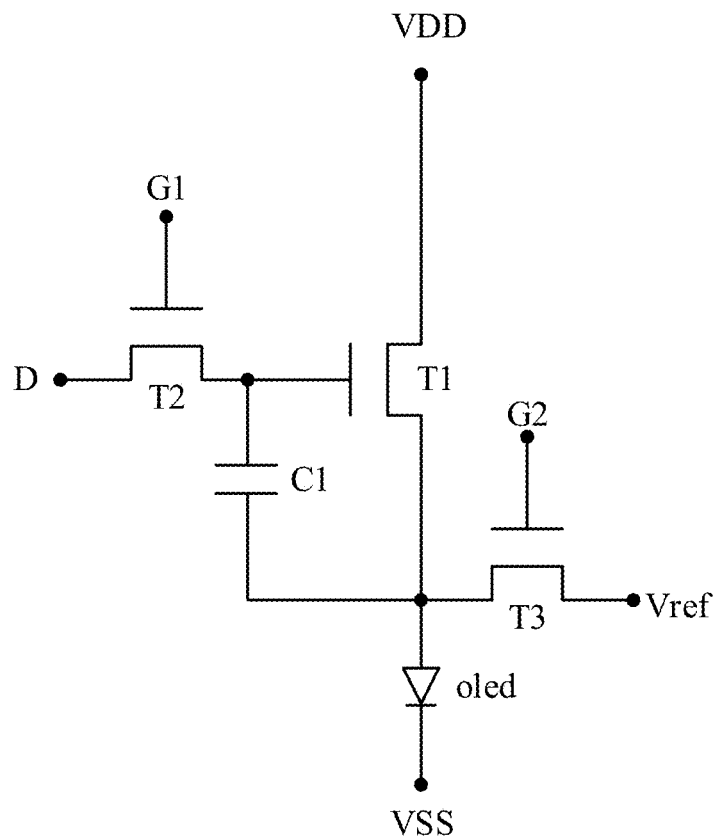
FIG. 2 is a schematic structural diagram of a pixel circuit provided by an embodiment of the present application.

During specific implementation, the display area includes a light-emitting pixel array, and the light-emitting pixel array mainly includes a pixel circuit located on the base substrate and an organic light-emitting diode connected with the pixel circuit. The pixel circuit is mainly composed of a plurality of transistors and capacitors, like a pixel circuit shown in FIG. 2.

Figure 3:
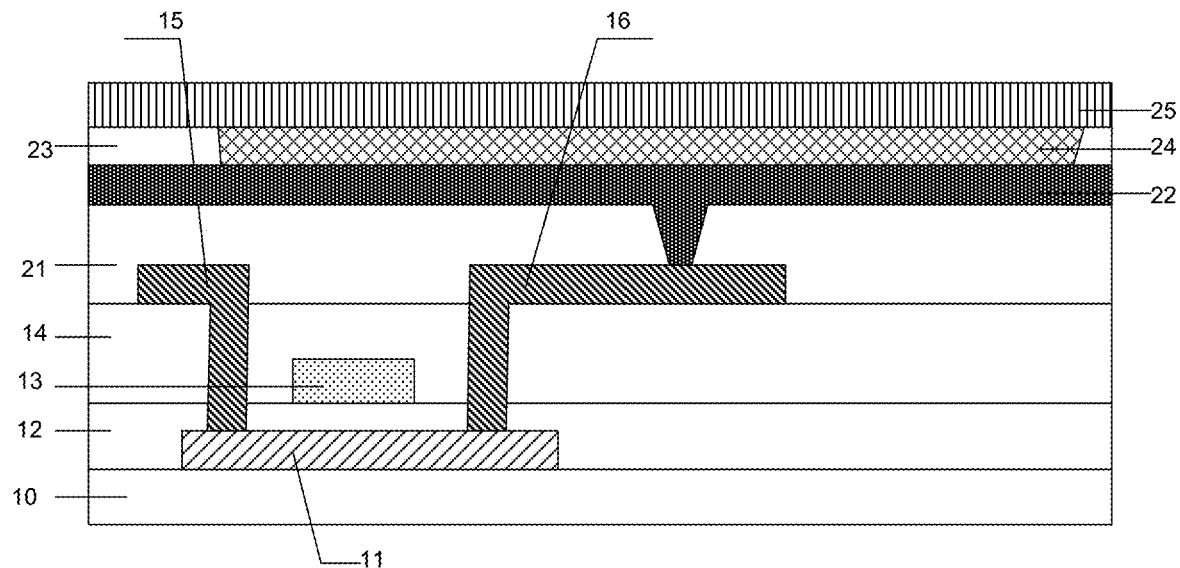
FIG. 3 is a schematic diagram of a cross-sectional structure of a display area in a display panel provided by an embodiment of the present application.

In some embodiments, as shown in FIG. 3, the display area includes an anode layer 22, a light-emitting layer 24 and a cathode layer 25 which are arranged on a side of the base substrate 10 in sequence in a laminated mode.

During specific implementation, as shown in FIG. 3, the display area further includes an active layer 11, a gate insulation layer 12, a gate 13, an interlayer dielectric layer 14, a source electrode 15, a drain electrode 16, a planarization layer 21 and a pixel defining layer 23 which are located on the base substrate 10. The source electrode 15 and the drain electrode 16 are on the same layer. In FIG. 3, a bottom-gate transistor is taken as an example of the transistors, and the application does not make limitations on a specific structure of the transistors which can be of a bottom-gate structure or a top-gate structure or other structures.

Figure 4:
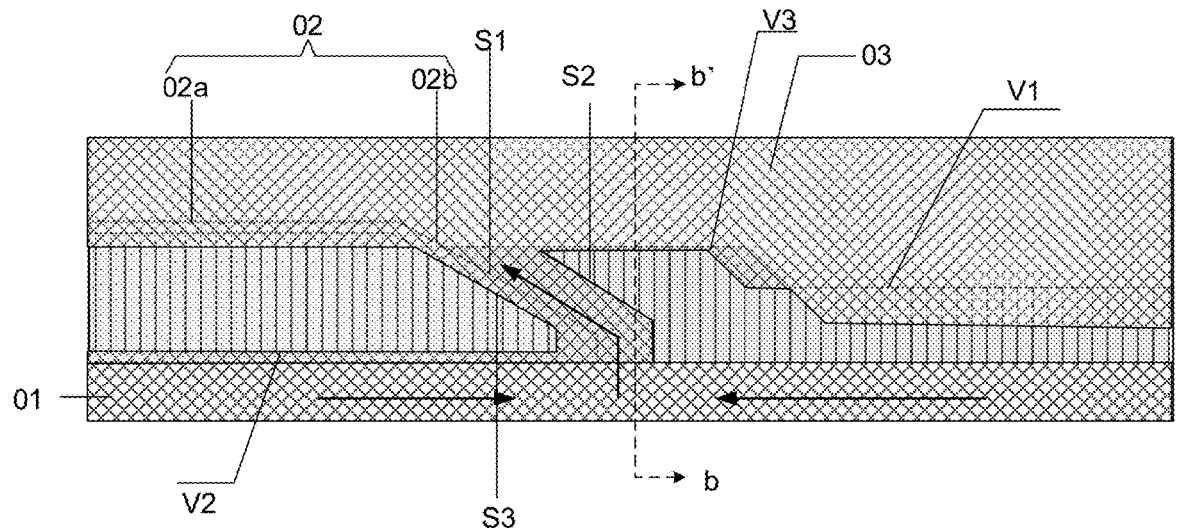
FIG. 4 is a first schematic diagram of a partial top-view structure of a display panel provided by an embodiment of the present application.

In the display panel provided by embodiments of the application, as shown in FIGS. 1 and 4, the bezel area A2 includes a first dam 01 surrounding the display area A1. A first metal layer, a first planarization layer 21_1 (not shown in FIGS. 1 and 4), an anode lap joint layer 02, a pixel defining layer 23 (not shown in FIGS. 1 and 4) and a cathode layer 25 (not shown in FIG. 4) which are arranged on a side of the base substrate (not shown in FIGS. 1 and 4) in sequence in a laminated mode are disposed between the first dam 01 and the display area A1. The first metal layer at least includes a first supply voltage wire VSS1 (not shown in FIG. 4). The anode lap joint layer 02 and the anode layer are arranged on the same layer. The cathode layer 25 is electrically connected with the first supply voltage wire VSS1 through the anode lap joint layer 02.

Figure 5:
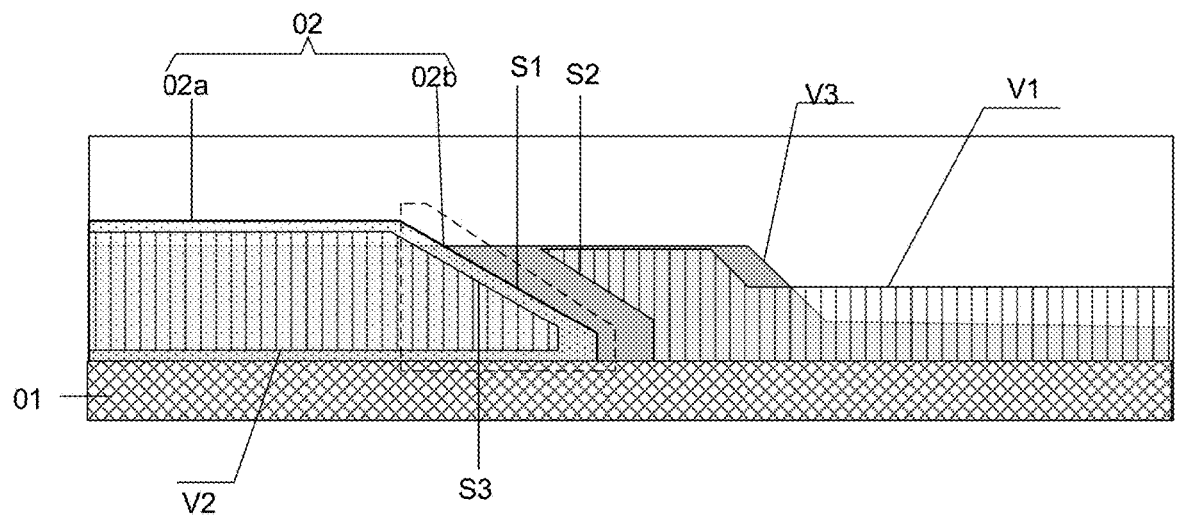
FIG. 5 is a second schematic diagram of a partial top-view structure of a display panel provided by an embodiment of the present application.

During specific implementation, the anode lap joint layer serves as a bridge for making the first supply voltage wire be electrically connected with the cathode layer, the smaller the resistance of the anode lap joint layer is, the better the display effect becomes. Thus the area of the anode lap joint layer needs to be increased. The area of the anode lap joint layer can be as large as possible when the anode lap joint layer is of an annular structure which surrounds the display area, however, it is found that during actual application, when the anode lap joint layer is of the annular structure, light leakage happens to a bottom side bezel of the display panel, and if the portion of the anode lap joint layer at the bottom side bezel of the display panel is removed, the problem of light leakage can be solved. Thus in some embodiments, the anode lap joint layer has an opening at the bottom side bezel of the display panel, and the anode lap joint layer has two cut-off ends. At the cut-off ends of the anode lap joint layer, in order to prevent static electricity from damaging a back plate circuit through the anode lap joint layer with high conductivity, a border of the anode lap joint layer needs to be wrapped with the pixel defining layer made of an organic material, and consequently a water vapor passageway is unavoidably formed herein. The water vapor passageway can be extended so as to reduce the risk of water vapor invasion. In the display panel provided by embodiments of the application, as shown in FIGS. 4 and 5, in FIG. 4, 03 represents an organic material layer. The organic material layer 03 may be the first planarization layer 21_1 or the pixel defining layer 23 or a lamination of the first planarization layer 21_1 and the pixel defining layer 23. FIG. 5 is a schematic structural diagram in which the organic material layer 03 in FIG. 4 is removed and a groove is reserved.

The anode lap joint layer 02 includes a main body portion 02a and sharp angle portions 02b located at the two ends of the main body portion 02a. The sharp angle portion 02b at least includes first side edge S1 close to the display area.

The pixel defining layer wraps the border of the anode lap joint layer 02 and has a first groove V1. The first groove V1 extends from one sharp angle portion 02b of the anode lap joint layer 02 to the other sharp angle portion 02b of the anode lap joint layer 02, is located at the side of the sharp angle portions 02b far away from the main body portion 02a and is formed at the side of the sharp angle portions 02b close to the display area. The edge of the first groove V1 adjacent to the first side edge S1 of the sharp angle portion 02b is a second side edge S2, and an outline of the second side edge S2 is consistent with that of the first side edge S1.

The first planarization layer has a second groove V3, and an orthographic projection of the second side edge S2 on the base substrate is located in an orthographic projection of the second groove V3 on the base substrate.

Figure 6:
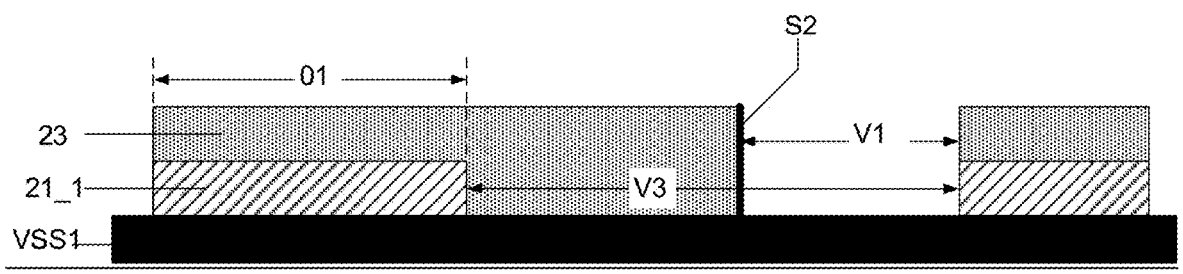
FIG. 6 is a schematic diagram of a cross-sectional structure of the display panel shown in FIG. 4 in a bb' direction.

According to the above-mentioned display panel provided by the embodiments of the application, as the orthographic projection of the second side edge of the first groove on the base substrate is located in the orthographic projection of the second groove on the base substrate, as shown in FIG. 6, at the second side edge S2 of the first groove V1, the pixel defining layer 23 and the first planarization layer 21_1 are grooved, and thus water vapor cannot pass through the first groove V1. As shown in FIG. 4, water vapor can invade into the display area only along the second side edge S2 of the first groove V1, a water vapor invasion path can refer to where an arrow in FIG. 4 points. Furthermore, the cut-off ends of the anode lap joint layer 02 are designed as the sharp angle portions 02b, and the outline of the second side edge S2 is consistent with that of the first side edge S1, so that the path between the second side edge S2 and the first side edges S1 is longer, the water vapor invasion path is extended, and the risk of water vapor invasion into the display area is reduced.

Optionally, in embodiments of the invention, as shown in FIGS. 4 and 5, the pixel defining layer further has a third groove V2.

An orthographic projection of the third groove V2 on the base substrate is located in an orthographic projection of the anode lap joint layer 02 on the base substrate. An edge of the third groove V2 adjacent to the first side edge S1 of the sharp angle portion 02b is a third side edge S3, and an outline of the third side edge S3 is consistent with that of the first side edge S1. An orthographic projection of the third side edge S3 on the base substrate is located in the orthographic projection of the second groove V3 on the base substrate. Accordingly, it is guaranteed that a water vapor passageway of the pixel defining layer exists only between the third side edge S3 and the second side edge S2, and as the outline of the third side edge S3 and the outline of the second side edge S2 are consistent with that of the first side edge S1, a water vapor invasion path between the third side edge S3 and the second side edge S2 is in the outline direction of the first side edges S1.

Figure 7A:
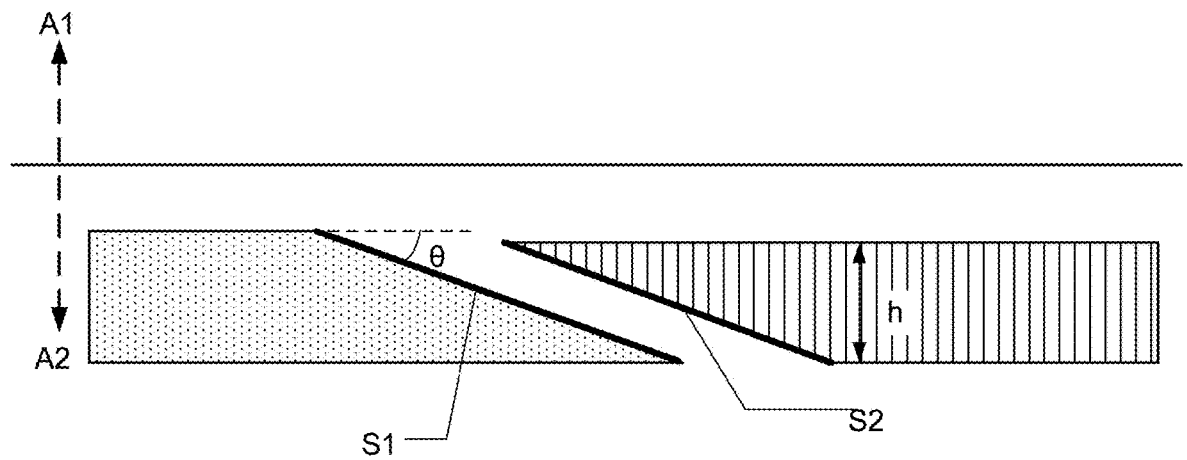
FIG. 7A is a first schematic diagram of a partial top-view structure of an anode lap joint layer and a first groove in a display panel provided by an embodiment of the present application.

Optionally, in the display panel provided by embodiments of the application, as shown in FIG. 7A, the first side edge of the sharp angle portion 02b close to the display area A1 is an oblique edge, an included angle θ between the oblique edge and the border of the display area A1 adjacent to the oblique edge is larger than 0° but smaller than 90°, thus a water vapor invasion path is extended, and the risk of water vapor invasion into the display area A1 is reduced.

During specific implementation, in FIG. 7A, the smaller the included angle θ is, the longer the water vapor invasion path becomes and the more difficult a process is, thus the water vapor barrier effect and the process difficulty are combined for consideration, and the included angle θ is set to be 5° to 30°, for example, when θ is equal to 22°, it can be guaranteed that the better water vapor barrier effect can be achieved on the basis of no increase of the process difficulty.

Furthermore, in embodiments of the invention, as shown in FIG. 7A, a width h of the first groove V1 in a direction perpendicular to the border of the display area A1 adjacent to the first groove V1 is 150 μm to 170 μm, like 155 μm, 160 μm or 166 μm, which is not limited herein. Then a length of a second oblique edge is h/tan θ, for example, θ is 30°, then the length of the second oblique edge is 2h, and thus the length of the water vapor invasion path can be doubled.

Figure 7B:
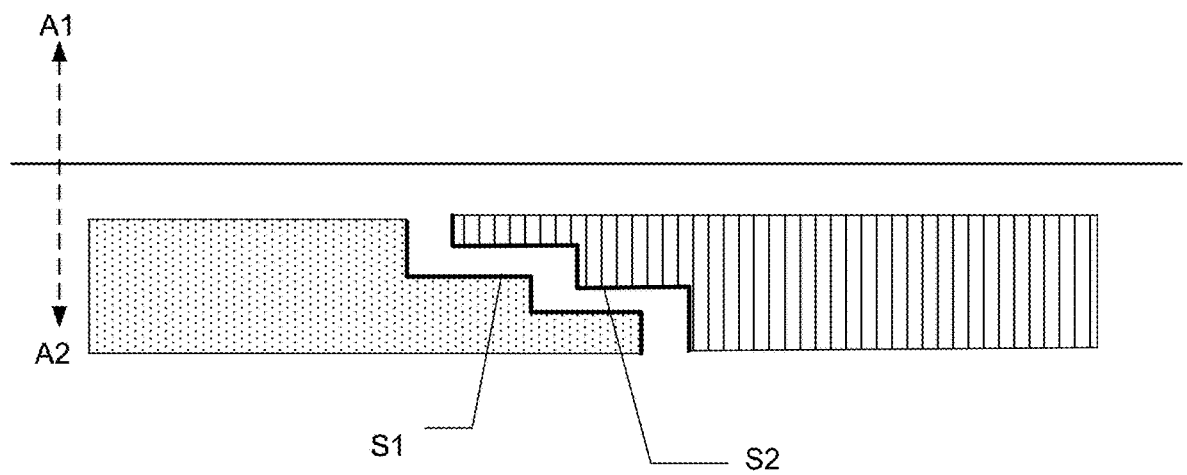
FIG. 7B is a second schematic diagram of a partial top-view structure of an anode lap joint layer and a first groove in a display panel provided by an embodiment of the present application.

Optionally, in the display panel provided by embodiments of the application, as shown in FIG. 7B, the side edge of the sharp angle portion close to the display area is in a step design. Thus the water vapor invasion path is extended by means of steps, and the risk of water vapor invasion into the display area A1 is reduced.

During specific implementation, in the display panel provided by embodiments of the application, the anode lap joint layer and the anode layer of the display area are arranged on the same layer, and the first supply voltage wire and the source electrode and the drain electrode in the display area are arranged on the same layer.

Figure 8:
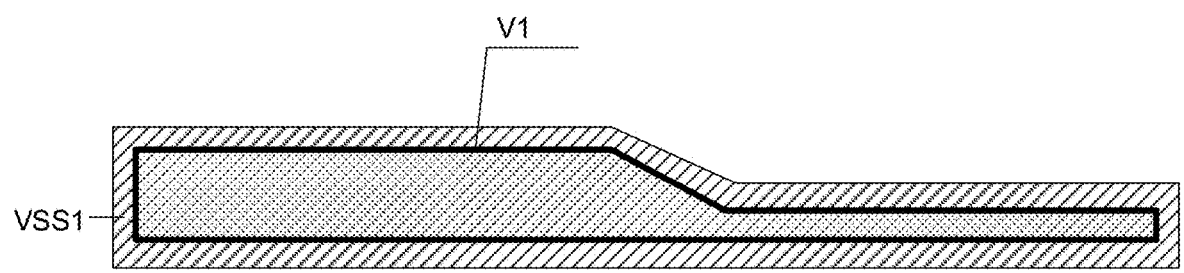
FIG. 8 is a schematic diagram of a partial top-view structure of an anode lap joint layer and a second groove in a display panel provided by an embodiment of the present application.

Optionally, in the display panel provided by embodiments of the application, as shown in FIG. 8, the first planarization layer wraps a border of the first supply voltage wire VSS1. The orthographic projection of the second groove V3 on the base substrate is located in an orthographic projection of the first supply voltage wire VSS1 on the base substrate. This is due to the fact that generally, the first supply voltage wire is of a Ti—Al—Ti structure, Al is prone to being eroded by an anode etching liquid during a subsequent process, and a side surface pit is formed. Besides, the anode etching liquid is prone to reacting with Ag in an anode, Ag ions exist in the anode etching liquid, consequently an elementary substance Ag can be obtained through replacement after reaction of the first supply voltage wire Al and the anode etching liquid, and if Ag is spread to the display area and causes a local dark spot, displaying is poor. Therefore, the first planarization layer 21_1 is adopted to wrap the border of the first supply voltage wire VSS1, and the risk that the first supply voltage wire VSS1 is etched by the subsequent process can be avoided.

Optionally, in the display panel provided by embodiments of the application, as shown in FIGS. 4 and 5, a pattern of the third groove V2 is similar to that of the anode lap joint layer 02, that is, an outline shape of the third groove V2 is the same as that of the anode lap joint layer 02, nevertheless, the area of the third groove V2 is smaller than that of the anode lap joint layer 02, accordingly the area of the third groove V2 can be as large as possible, one the one hand, a maximum contact area between the anode lap joint layer and the first supply voltage wire can be guaranteed, and on the other hand, the larger the area of the third groove V2 is, the better the effect of stopping water vapor from invading the display area becomes.

Figure 9:
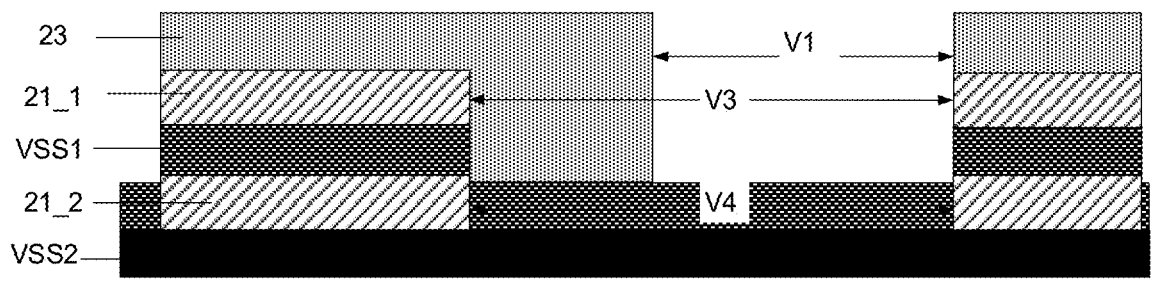
FIG. 9 is a schematic diagram of a cross-sectional structure of a display panel provided by an embodiment of the present application.

Optionally, in the display panel provided by embodiments of the application, as shown in FIG. 9, the bezel area further includes:

a second supply voltage wire VSS2 located between the base substrate and the first supply voltage wire VSS1; and a second planarization layer 21_2 located between the second supply voltage wire VSS2 and the first supply voltage wire VSS1.

The second planarization layer 21_2 has a fourth groove V4, and an orthographic projection of the fourth groove V4 on the base substrate covers the orthographic projection of the second groove V3 on the base substrate. FIG. 9 makes an illustration with the fourth groove V4 and the second groove V3 overlapped, and in FIG. 9, the first supply voltage wire VSS1 is located between the first planarization layer 21_1 and the second planarization layer 21_2.

The first supply voltage wire VSS1 is electrically connected with the second supply voltage wire VSS2 through the fourth groove V4.

The above-mentioned display panel is of a double-layer supply voltage wire structure, and the overall resistance of the supply voltage wires can be reduced through two layers of the supply voltage wires. The orthographic projection of the fourth groove V4 on the base substrate at least covers the orthographic projection of the second groove V3 on the base substrate, and the water vapor path at the cut-off ends of the anode lap joint layer cannot be affected by arrangement of the second planarization layer 21_2.

Optionally, in the display panel provided by embodiments of the application, as shown in FIG. 9, the orthographic projection of the fourth groove V4 on the base substrate coincides with the orthographic projection of the second groove V3 on the base substrate.

Optionally, in the display panel provided by embodiments of the application, the orthographic projection of the first supply voltage wire on the base substrate coincides with an orthographic projection of the second supply voltage wire on the base substrate. Certainly, during specific implementation, the sizes of the first supply voltage wire and the second supply voltage wire can differ, which is not limited herein.

Optionally, the display panel provided by embodiments of the application further includes a thin film packaging layer. The thin film packaging layer is composed of a laminated structure of an organic layer and an inorganic layer. The organic layer in the thin film packaging layer is generally formed in an ink-jet printing mode, thus the first dam surrounds the display area so that ink of the organic layer can be prevented from spreading to the outside of the base substrate during forming. The first dam can be formed of a material which is same as that of some film layers in the display area, for example, the first dam can be formed by the first planarization layer, the second planarization layer and the pixel defining layer during patterning, which is not limited herein.

Figure 10:
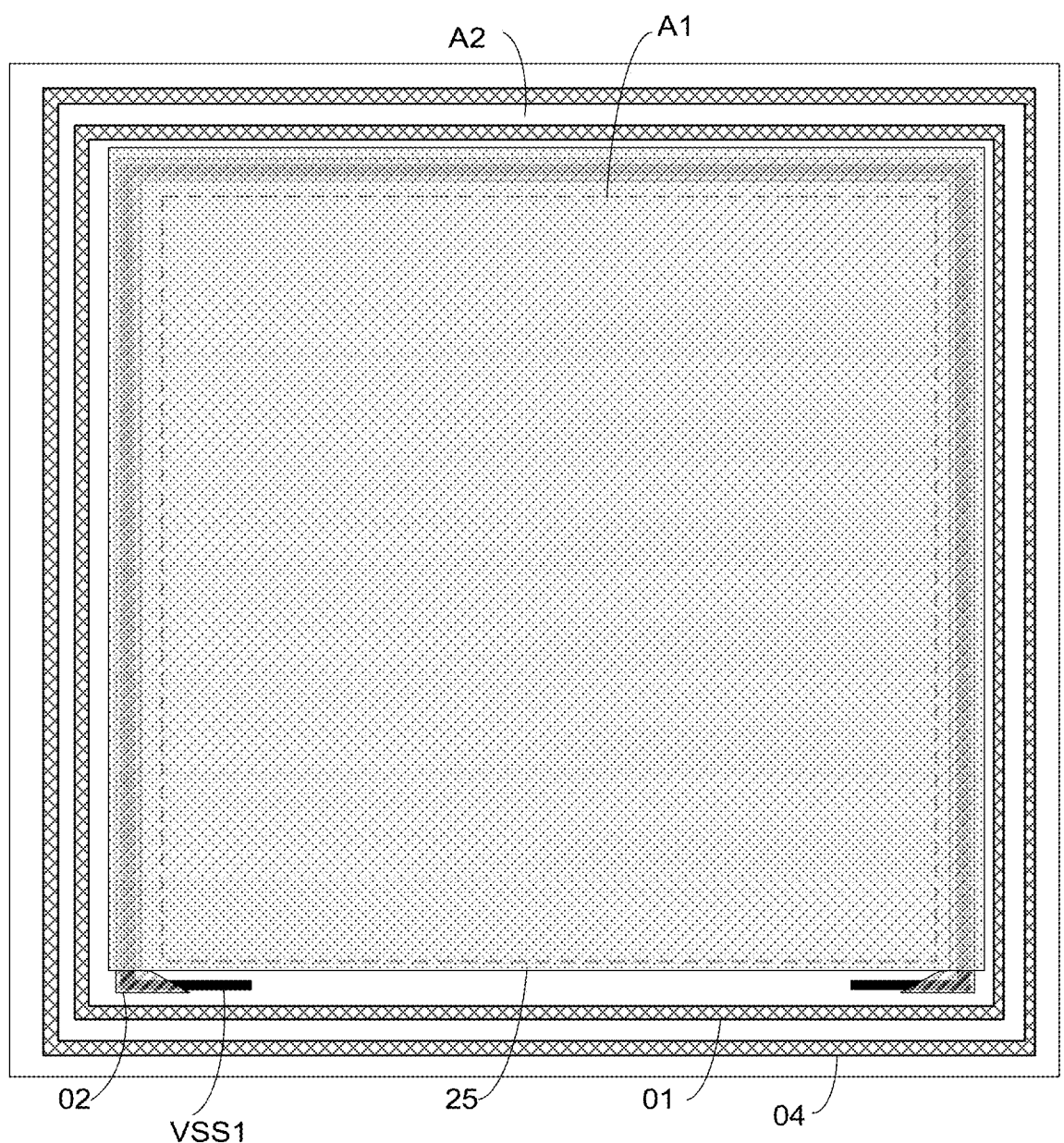
FIG. 10 is a second schematic diagram of a top-view structure of a display panel provided by an embodiment of the present application.

Optionally, in the display panel provided by embodiment of the present application, as shown in FIG. 10, the bezel area A2 further includes a second dam 04 surrounding the first dam 01.

Specifically, the pixel defining layer and the first planarization layer cover an area where the second dam is located. The pixel defining layer has a fifth groove in an area corresponding to a gap between the first dam and the second dam. The first planarization layer has a sixth groove in an area corresponding to the gap between the first dam and the second dam. The second dam is arranged to surround the first dam so that the display panel can be further protected. The effect of stopping water vapor from invading the display area can be further achieved by arrangement of the fifth groove and the sixth groove.

Furthermore, the second planarization layer covers the area where the second dam is located and has a seventh groove in an area corresponding to the gap between the first dam and the second dam.

During specific implementation, in the display panel provided by embodiments of the application, the base substrate can be formed of any proper flexible insulating material. For example, the base substrate can be formed of polymer materials such as polyimide (PI), polycarbonate (PC), polyether sulfone (PES), polyethylene terephthalate (PET), polyethylene naphthalate (PEN), polyarylate (PAR) or fiber reinforced plastic (FRP).

Based on the same inventive concept, embodiments of the application further provide a display device, including a driving chip and any one of the display panels provided by the embodiments of the application. The display device can be a mobile phone or a tablet PC or any other flexible product or component with the display function. The implementation of the display device can refer to the embodiments of the above-mentioned display panels, and no description is given to repetitions.

According to the display panel and the display device provided by the embodiments of the application, as the orthographic projection of the second side edge of the first groove on the base substrate is located in the orthographic projection of the second groove on the base substrate, at the second side edge of the first groove, the pixel defining layer and the first planarization layer are grooved so that water vapor cannot pass through the first groove, and as shown in FIG. 4, water vapor can invade into the display area only along the second side edge of the first groove. Furthermore, as the cut-off ends of the anode lap joint layer are in a design of the sharp angle portions, and the outline of the second side edge is consistent with that of the first side edge, the path between the second side edge and the first side edge is longer, then the water vapor invasion path is extended, and the risk of water vapor invasion into the display area is reduced.

Apparently, those skilled in the art can make various changes and variations for the present application without departing from the spirit and scope of the present application. Therefore, if the changes and the variations for the present application are within the scope of the claims of the present application and identical technologies thereof, the present application intends to include the changes and the variations.

What is claimed is:

1. A display panel, comprising a base substrate, wherein the base substrate is provided with a display area and a bezel area surrounding the display area; the bezel area comprises a first dam surrounding the display area;
   the display area comprises an anode layer, a light-emitting layer and a cathode layer arranged on a side of the base substrate in sequence in a laminated mode;
   a first metal layer, a first planarization layer, an anode lap joint layer, a pixel defining layer and the cathode layer arranged on the side of the base substrate in sequence in a laminated mode are disposed between the first dam and the display area;
   the first metal layer at least comprises a first supply voltage wire;
   the anode lap joint layer and the anode layer are arranged on a same layer;
   the cathode layer is electrically connected with the first supply voltage wire through the anode lap joint layer;
   the anode lap joint layer comprises a main body portion and sharp angle portions located at two ends of the main body portion; the sharp angle portion at least comprises a first side edge close to the display area; the first side edge of the sharp angle portion close to the display area is an oblique edge, and an included angle between the oblique edge and a border of the display area adjacent to the oblique edge is larger than 0° but smaller than or equal to 30°;
   the pixel defining layer wraps a border of the anode lap joint layer and is provided with a first groove, the first groove extends from one sharp angle portion of the anode lap joint layer to the other sharp angle portion of the anode lap joint layer, is located at a side of the sharp angle portion far away from the main body portion and is formed at a side of the sharp angle portion close to the display area, an edge of the first groove adjacent to the first side edge of the sharp angle portion is a second side edge, and an outline of the second side edge is consistent with an outline of the first side edge; and
   the first planarization layer is provided with a second groove, and an orthographic projection of the second side edge on the base substrate is located in an orthographic projection of the second groove on the base substrate.

2. The display panel according to claim 1, wherein: the first side edge of the sharp angle portion close to the display area is in a step design.

3. The display panel according to claim 1, wherein: the pixel defining layer is further provided with a third groove;
   an orthographic projection of the third groove on the base substrate is located in an orthographic projection of the anode lap joint layer on the base substrate;
   an edge of the third groove adjacent to the first side edge of the sharp angle portion is a third side edge, and an outline of the third side edge is consistent with an outline of the first side edge; and
   an orthographic projection of the third side edge on the base substrate is located in the orthographic projection of the second groove on the base substrate.

4. The display panel according to claim 1, wherein:
   the first planarization layer wraps a border of the first supply voltage wire; and
   the orthographic projection of the second groove on the base substrate is located in an orthographic projection of the first supply voltage wire on the base substrate.

5. The display panel according to claim 1, wherein the bezel area further comprises:
   a second supply voltage wire located between the base substrate and the first supply voltage wire; and
   a second planarization layer located between the second supply voltage wire and the first supply voltage wire;
   the second planarization layer is provided with a third groove, and an orthographic projection of the third groove on the base substrate at least covers the orthographic projection of the second groove on the base substrate; and
   the first supply voltage wire is electrically connected with the second supply voltage wire through the third groove.

6. The display panel according to claim 5, wherein:
   the orthographic projection of the third groove on the base substrate coincides with the orthographic projection of the second groove on the base substrate.

7. The display panel according to claim 5, wherein:
   an orthographic projection of the first supply voltage wire on the base substrate coincides with an orthographic projection of the second supply voltage wire on the base substrate.

8. The display panel according to claim 1, wherein:
   the bezel area further comprises a second dam surrounding the first dam;
   the pixel defining layer and the first planarization layer both cover an area where the second dam is located;
   the pixel defining layer is provided with a third groove in an area corresponding to a gap between the first dam and the second dam; and
   the first planarization layer is provided with a fourth groove in an area corresponding to the gap between the first dam and the second dam.

9. A display device, comprising a driving chip and a display panel, wherein the display panel comprises a base substrate; the base substrate is provided with a display area and a bezel area surrounding the display area; the bezel area comprises a first dam surrounding the display area;
   the display area comprises an anode layer, a light-emitting layer and a cathode layer arranged on a side of the base substrate in sequence in a laminated mode;
   a first metal layer, a first planarization layer, an anode lap joint layer, a pixel defining layer and the cathode layer arranged on the side of the base substrate in sequence in a laminated mode are disposed between the first dam and the display area;
   the first metal layer at least comprises a first supply voltage wire;
   the anode lap joint layer and the anode layer are arranged on a same layer;

the cathode layer is electrically connected with the first supply voltage wire through the anode lap joint layer;

the anode lap joint layer comprises a main body portion and sharp angle portions located at two ends of the main body portion; the sharp angle portion at least comprises a first side edge close to the display area; the first side edge of the sharp angle portion close to the display area is an oblique edge, and an included angle between the oblique edge and a border of the display area adjacent to the oblique edge is larger than 0° but smaller than or equal to 30°;

the pixel defining layer wraps a border of the anode lap joint layer and is provided with a first groove, the first groove extends from one sharp angle portion of the anode lap joint layer to the other sharp angle portion of the anode lap joint layer, is located at a side of the sharp angle portion far away from the main body portion and is formed at a side of the sharp angle portion close to the display area, an edge of the first groove adjacent to the first side edge of the sharp angle portion is a second side edge, and an outline of the second side edge is consistent with an outline of the first side edge; and the first planarization layer is provided with a second groove, and an orthographic projection of the second side edge on the base substrate is located in an orthographic projection of the second groove on the base substrate.

10. The display device according to claim 9, wherein: the first side edge of the sharp angle portion close to the display area is in a step design.

11. The display device according to claim 9, wherein: the pixel defining layer is further provided with a third groove;

an orthographic projection of the third groove on the base substrate is located in an orthographic projection of the anode lap joint layer on the base substrate;

an edge of the third groove adjacent to the first side edge of the sharp angle portion is a third side edge, and an outline of the third side edge is consistent with an outline of the first side edge; and an orthographic projection of the third side edge on the base substrate is located in the orthographic projection of the second groove on the base substrate.

12. The display device according to claim 9, wherein: the first planarization layer wraps a border of the first supply voltage wire; and the orthographic projection of the second groove on the base substrate is located in an orthographic projection of the first supply voltage wire on the base substrate.

13. The display device according to claim 9, wherein the bezel area further comprises:

a second supply voltage wire located between the base substrate and the first supply voltage wire; and a second planarization layer located between the second supply voltage wire and the first supply voltage wire;

the second planarization layer is provided with a third groove, and an orthographic projection of the third groove on the base substrate at least covers the orthographic projection of the second groove on the base substrate; and the first supply voltage wire is electrically connected with the second supply voltage wire through the third groove.

14. The display device according to claim 13, wherein: the orthographic projection of the third groove on the base substrate coincides with the orthographic projection of the second groove on the base substrate.

15. The display device according to claim 13, wherein: an orthographic projection of the first supply voltage wire on the base substrate coincides with an orthographic projection of the second supply voltage wire on the base substrate.

16. The display device according to claim 9, wherein: the bezel area further comprises a second dam surrounding the first dam;

the pixel defining layer and the first planarization layer both cover an area where the second dam is located;

the pixel defining layer is provided with a third groove in an area corresponding to a gap between the first dam and the second dam; and the first planarization layer is provided with a fourth groove in an area corresponding to the gap between the first dam and the second dam.

\* \* \* \* \*